(12) United States Patent
Mallinson (10) Patent No.: US 11,934,799 B2
(45) Date of Patent: Mar. 19, 2024

(54) COMBINATORIAL LOGIC CIRCUITS WITH FEEDBACK

(71) Applicant: SiliconIntervention Inc., Kelowna (CA)

(72) Inventor: A. Martin Mallinson, Kelowna (CA)

(73) Assignee: SiliconIntervention Inc., Kelowna (CA)

( * ) Notice: Subject to any disclaimer, the term of this patent is extended or adjusted under 35 U.S.C. 154(b) by 246 days.

(21) Appl. No.: 17/400,937

(22) Filed: Aug. 12, 2021

(65) Prior Publication Data

US 2022/0057991 A1 Feb. 24, 2022

Related U.S. Application Data

(60) Provisional application No. 63/067,513, filed on Aug. 19, 2020.

(51) Int. Cl.
*G06F 7/552* (2006.01)
*H03K 19/20* (2006.01)

(52) U.S. Cl.
CPC .......... *G06F 7/5525* (2013.01); *H03K 19/20* (2013.01)

(58) Field of Classification Search
CPC ........ G06F 7/4873; G06F 7/535; G06F 7/552; G06F 7/5525; G06F 2207/5353; G06F 2207/5526

See application file for complete search history.

(56) References Cited

U.S. PATENT DOCUMENTS

| 4,470,019 A * | 9/1984 | Keyes, IV ................ G06J 1/00 327/334 |
| 4,866,655 A * | 9/1989 | Nishiyama ............ G06F 7/5375 708/670 |
| 6,473,779 B1 * | 10/2002 | Wolf ................... H03M 13/151 708/492 |

(Continued)

OTHER PUBLICATIONS

Zhang, Hao, Jiongrui He, and Seok-Bum Ko. "Efficient posit multiply-accumulate unit generator for deep learning applications." 2019 IEEE international symposium on circuits and systems (ISCAS). IEEE, 2019. (Year: 2019).*

(Continued)

*Primary Examiner* — Matthew D Sandifer
(74) *Attorney, Agent, or Firm* — Gard & Kaslow LLP (57) ABSTRACT

Combinatorial logic circuits with feedback, which include at least two combinatorial logic elements, are disclosed. At least one of the combinatorial logic elements receives an external input (i.e., from outside the circuit), at least one of the combinatorial logic elements receives an input that is feedback of the circuit output, and at least one of the combinatorial logic elements receives an input that is neither an external input nor an output of the circuit but rather is from another of the combinatorial logic elements and thus only "implicit" to the circuit. No staticizers are needed; the logic circuits effectively create implicit equations to perform functions that were previously thought to require sequential logic. The combinatorial logic circuits result in a stable output (in some instances after a brief period of time) due to the implicit equations, rather than achieving stability from an explicit expression of some input to the circuit.

3 Claims, 7 Drawing Sheets

(56) References Cited

U.S. PATENT DOCUMENTS

| | | | |
|---|---|---|---|
| 7,546,331 B2* | 6/2009 | Islam | G06F 7/5312 |
| | | | 708/627 |
| 8,161,427 B2 | 4/2012 | Morgenshtein et al. | |
| 2004/0003015 A1* | 1/2004 | Manor | G06F 7/535 |
| | | | 708/605 |
| 2004/0010536 A1* | 1/2004 | Moreno | G06F 7/53 |
| | | | 708/625 |
| 2006/0123300 A1* | 6/2006 | Gupta | G06F 30/35 |
| | | | 714/741 |
| 2014/0247081 A1* | 9/2014 | Yeung | H03K 19/0185 |
| | | | 327/333 |

OTHER PUBLICATIONS

Takagi, Naofumi, and Shuzo Yajima. "A square root hardware algorithm using redundant binary representation." Systems and Computers in Japan 17.11 (1986): 30-41. (Year: 1986).*

Jiang, Honglan, Fabrizio Lombardi, and Jie Han. "Low-power unsigned divider and square root circuit designs using adaptive approximation." IEEE Transactions on Computers 68.11 (2019): 1635-1646. (Year: 2019).*

Mandelbaum, David M. "A method for calculation of the square root using combinatorial logic." Journal of VLSI signal processing systems for signal, image and video technology 6.3 (1993): 233-242. (Year: 1993).*

Chen, Linbin, et al. "Design of approximate unsigned integer non-restoring divider for inexact computing." Proceedings of the 25th edition on Great Lakes Symposium on VLSI. 2015. (Year: 2015).*

Accellera, "Verilog-AMS Reference Manual," The Designer's Guide Community, Version 2.4.0, May 30, 2014.

* cited by examiner

FIG. 1

(Prior Art)

(Prior Art)

(Prior Art)

(Prior Art)

FIG. 7

(Prior Art)

COMBINATORIAL LOGIC CIRCUITS WITH FEEDBACK

This application claims priority from Provisional Application No. 63/067,513, filed Aug. 19, 2020, which is incorporated by reference herein in its entirety.

FIELD OF THE INVENTION

The present invention relates generally to combinatorial logic circuits, and more particularly to combinatorial logic circuits with feedback.

BACKGROUND OF THE INVENTION

Digital signals are processed by digital logic circuits that can be built with various logic gates. Digital logic circuits connect the various logic gates in certain combinations in order to produce a desired output and are mainly classified into two types, sequential logic circuits and combinatorial logic circuits (also called combinational logic circuits).

A logic gate is an electronic device implementing a Boolean function, a logical operation performed on one or more binary inputs that produces a single binary output. Such logic gates include the functions of AND, OR, NAND, NOR, XAND and XNOR, as well as buffers and inverters.

Combinatorial logic circuits are generally regarded as circuits constructed from a combination of two or more such logic gates in which the present state of the combination of the logic inputs directly determines the output without regard to previous input. Combinatorial logic circuits are often situated between staticizing elements such as gate latches, delay elements, flip-flops, etc., and the use of the logic gates is always in a forward flowing path. In sequential logic circuits, by contrast, the output may depend upon a previous input or output and staticizing or delay elements are often included.

Combinatorial circuits are used in a wide variety of applications including calculators, digital measuring techniques, computers, digital processing, automatic control of machines, industrial processing, digital communications, etc. Different types of combinatorial logic circuits are used for various applications. By using a combination of logic gates, more complex combinatorial circuits can be implemented such as multiplexers and de-multiplexers, comparators, adders, subtractors, multipliers, converters, encoder/decoders, etc.

Figure 1:
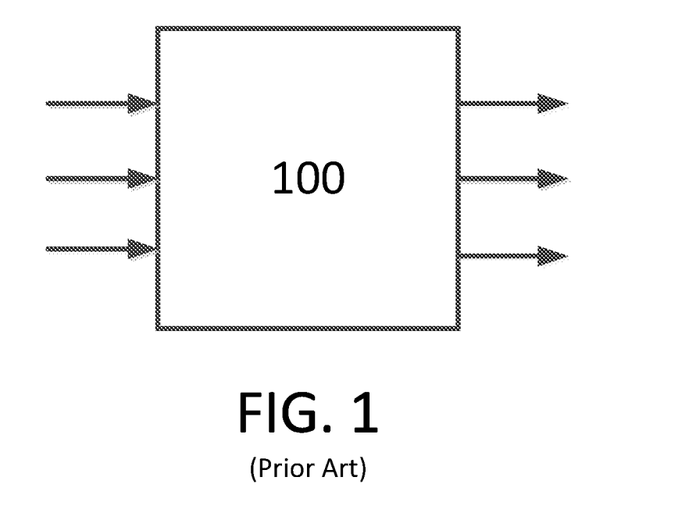
FIG. 1 is a diagram of a combinatorial logic circuit without feedback as is known in the prior art.

FIG. 1 is a diagram of a generic "next state" generator, a combinatorial logic circuit 100 without feedback as is known in the prior art. Logic circuit 100 contains some number of logic gates selected to generate one or more outputs from one or more inputs that are applied to logic circuit 100. There are no staticizing elements in logic circuit 100, and however complex the logic in circuit 100 is, the outputs are dependent only upon the present state of the inputs and the signals only propagate forward. Almost all prior art combinatorial logic circuits may be represented by a diagram such as that of FIG. 1.

However, certain functions have not been considered possible with combinatorial logic circuits, but rather have required sequential logic circuits to achieve. Further, the use of such feedback of an output of any logic circuit as an input to one or more of the logic gates has been limited to extremely simple cases, as feedback in combinatorial logic circuits is generally considered to result in instability.

SUMMARY OF THE INVENTION

Described herein are combinatorial logic circuits with feedback, which are able to perform functions previously thought to require sequential logic.

One embodiment describes a combinatorial circuit with feedback for producing a circuit output in response to one or more circuit inputs, comprising: a plurality of combinatorial logic elements, each configured to receive a plurality of element inputs and to produce an element output; wherein: the element output of one of the plurality of combinatorial logic elements is the circuit output; an element input to at least one of the plurality of combinatorial logic elements is a circuit input; and an element input to at least one of the combinatorial logic elements is feedback of the combinatorial circuit output.

Another embodiment describes a combinatorial circuit with feedback for producing a circuit output in response to one or more circuit inputs, comprising: a first combinatorial logic element configured to receive a plurality of element input values and to produce an element output value, one of the element input values to the first combinatorial logic element being a circuit input; a second combinatorial logic element configured to receive a plurality of element input values and to produce an element output value, one of the element input values to the second combinatorial logic element being the element output value of the first combinatorial logic element; and wherein at least one of the element input values to the first combinatorial logic element or the second combinatorial logic element is feedback of the combinatorial circuit output.

Still another embodiment describes a combinatorial circuit with feedback for producing an output that is the result of dividing one number by another, comprising: a combinatorial logic adder configured to receive two input values and to produce an output value that is the sum of the two input values to the adder, one of the input values to the adder being a first circuit input; a combinatorial circuit multiplier configured to receive two input values, one of the input values to the multiplier being a second circuit input and the other input value to the multiplier being the output of the adder, and to produce an output value that is the product of the two input values to the multiplier and is fed back as an input to the adder; thereby producing the output from the multiplier as the output of the circuit that is equal to the second circuit input divided by a number equal to one minus the first circuit input.

Yet another embodiment describes a combinatorial circuit with feedback for producing an output that is the square root of an input, comprising: a first combinatorial logic adder configured to receive two input values and to produce an output value that is the sum of the two input values to the first adder and is the output of the circuit, one of the inputs to the adder being an inverse of a circuit input; a combinatorial circuit multiplier configured to receive two input values, each of the input values to the multiplier being feedback of the output of the circuit, and to produce an output value that is the product of the two input values to the multiplier and thereby a value that is a square of the output value; and a second combinatorial logic adder configured to receive two input values and to produce an output value that is the sum of the two input values to the second adder, one of the inputs to the second adder being the output of the multiplier and the other input to the second adder being the output of the circuit, the output of the second adder being fed back as an input to the first adder; thereby producing a circuit output that is the square root of the circuit input.

DETAILED DESCRIPTION OF THE INVENTION

Described herein are combinatorial logic circuits with feedback, which include at least two combinatorial logic elements. At least one of the combinatorial logic elements receives an external input (i.e., from outside the circuit), at least one of the combinatorial logic elements receives an input that is feedback of the circuit output, and at least one of the combinatorial logic elements receives an input that is neither an external input nor an output of the circuit but rather is from another of the combinatorial logic elements and thus only "internal" or "implicit" to the circuit. No staticizers are needed, but rather the logic circuits effectively create implicit equations to perform functions that were previously thought to require sequential logic. The combinatorial logic circuits result in a stable output (in some instances after a brief period of time) due to the implicit equations, rather than achieving stability from an explicit expression of some input to the circuit as in some prior art cases.

As used herein, a "combinatorial logic element" includes, but is not limited to, a logic element such as a multiplexer or de-multiplexer, comparator, adder, subtractor, multiplier, converter, encoder/decoder, etc. Each combinatorial logic element receives at least two inputs that are binary numbers of more than one digit, i.e., not merely a 1 or a 0 (although as described herein in some cases both multi-digit inputs may be the same value), and thus the inputs to each combinatorial logic element are buses with a width greater than one bit. This definition thus excludes circuit elements that are only the simple logic gates discussed above such as inverters, AND, OR, NAND, NOR, XAND and XOR gates (although some combination of such logic gates may be used to form the combinatorial logic elements), as well as other prior art circuits described herein.

Figure 2:
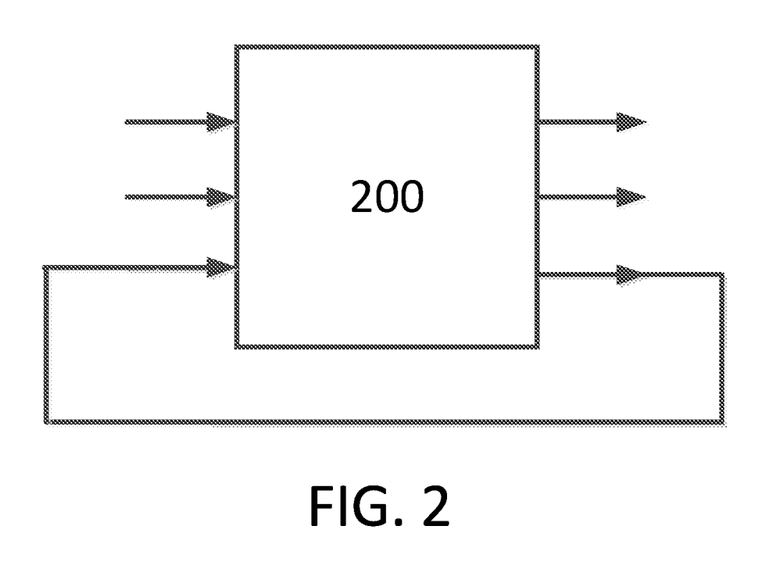
FIG. 2 is a diagram of a combinatorial logic circuit with feedback according to one embodiment of the present approach.

FIG. 2 is a diagram of a combinatorial logic circuit 200 with feedback according to one embodiment of the present approach. Circuit 200 is a generic next-state generator block that, as above, contains at least two combinatorial logic elements and no staticizers. As illustrated in FIG. 2, circuit 200 receives two external inputs, and one input that is a feedback of the output of the circuit; some embodiments according to the present approach may include one or more external inputs and one or more instances of feedback, i.e., the output of the circuit is an input to a combinatorial logic element in the circuit. The feedback may be an input to any combinatorial logic element within circuit 200 as desired to perform the intended function of circuit 200.

It is believed that the use of a combinatorial logic circuit with feedback such as shown in combinatorial logic circuit 200 is not known in the prior art. As stated above, the use of any feedback with logic gates is rare in the prior art as it is generally considered to result in an undefined output (the feedback of the output immediately affecting the input and overwriting the output) and thus instability of the circuit.

Figure 3:
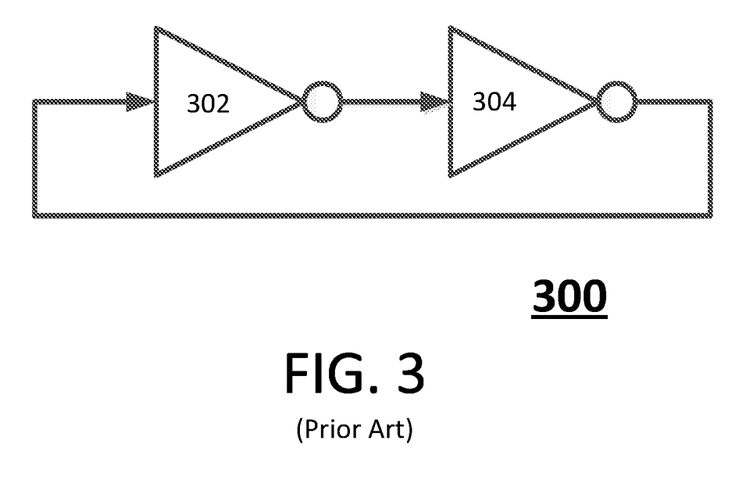
FIG. 3 is a diagram of a memory cell as is known in the prior art.

FIG. 3 shows one of the few examples in which feedback is used with logic elements in the prior art. FIG. 3 is a diagram of a memory cell 300 according to one embodiment as is known in the prior art. Memory cell 300 contains two single-bit inverters 302 and 304 in series, with the output of memory cell 300 fed back to its input, i.e., the output of the second inverter 304 fed back as an input to the first inverter 302. This particular combinatorial logic circuit with feedback is stable; the output bit from inverter 304 is fed back and then inverted twice, once by inverter 302 and again by inverter 304, thus resulting in the same output bit at the output of the inverter 304. The output of memory cell 300 will not change unless some outside signal (not shown) causes the memory cell to change state.

Figure 4:
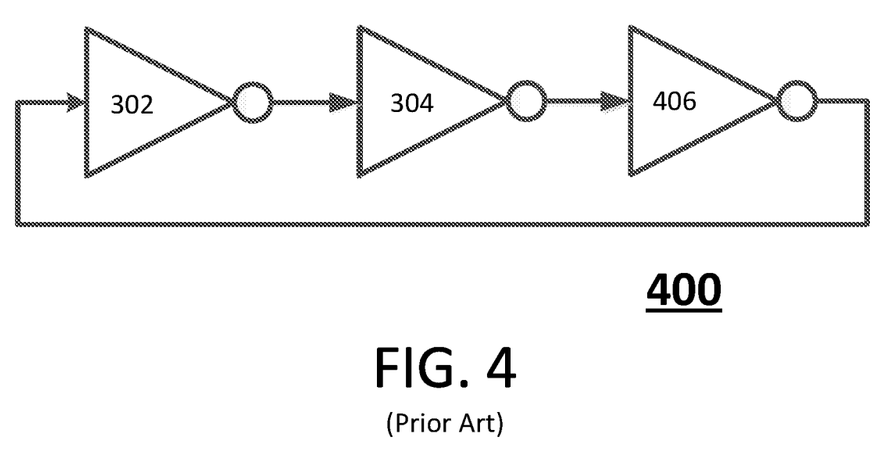
FIG. 4 is a diagram of a three-gate ring oscillator as is known in the prior art.

However, as stated above, in most cases the use of feedback in a combinatorial logic circuit has previously been believed to cause instability, and a few prior art circuits exploit this effect. FIG. 4 is a diagram of a circuit 400 as is known in the prior art. Adding a third inverter 406 to the two inverters 302 and 304 contained in the memory cell 300 of FIG. 3 now makes circuit 400 unstable. The output of the third inverter 406 will oscillate between the values of 1 and 0, since each inverter will reverse the value of its input and there is an odd number of inverters.

Thus, if the output of inverter 406, and thus the input to inverter 302, is a 1, the output of inverter 302 will be a 0, the output of inverter 304 will be a 1, and the output of inverter 406 is caused to switch from 1 to 0. This will happen continuously in the absence of a staticizer, so that the output of inverter 406 oscillates. It is for this reason that circuit 400 is known as a three-gate ring oscillator.

Figure 5:
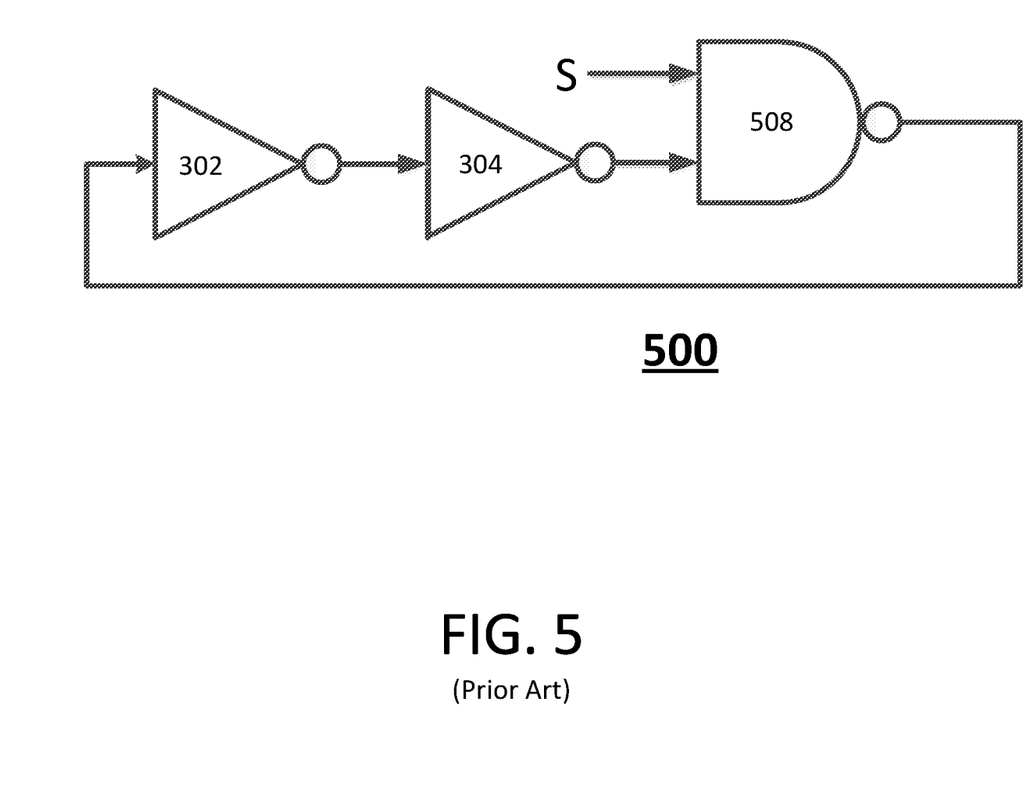
FIG. 5 is a diagram of another three-gate logic circuit as is known in the prior art.

FIG. 5 is a diagram of another three gate logic circuit 500 as is known in the prior art. In circuit 500, the third inverter 406 of the three-gate ring oscillator of FIG. 4 is replaced by a NAND gate 508. NAND gate 508 has two inputs, and in addition to receiving the output of inverter 304 as an input, NAND gate 508 also receives an input signal S. The input signal S operates as a control input that causes the output of NAND gate 508 to either oscillate or not; if S is 0, circuit 500 is stable and the output of NAND gate 508, and thus of circuit 500, is high, while if S is 1, the ring is unstable and its output will oscillate.

In the general case, as in circuit 400 of FIG. 4, combinatorial logic circuits with feedback in the known art are unstable. However, as in the case of circuit 500 of FIG. 5, in some instances such circuits may have additional inputs designed to overcome the oscillating state. Circuits according to the present approach are able to achieve a stable state without an explicit expression derived from the input such as input signal S in FIG. 5.

Figure 6:
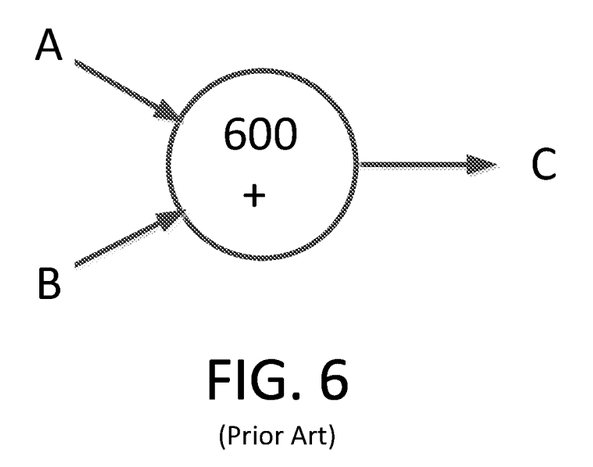
FIG. 6 is a diagram of an adder as is known in the prior art.

As is known in the prior art, combinatorial logic circuits may be constructed to perform various mathematical functions. FIG. 6 is a diagram of an adder 600, as indicated by the "+" symbol in the figure, as is known in the prior art. Adder 600 has input buses A and B and an output bus C (again, as stated above, by being buses each has a width greater than one bit). Digital numbers on the input buses A and B cause, through the combinatorial logic of adder 600, a digital number to appear on the output bus C that is the sum of the input numbers.

Figure 7:
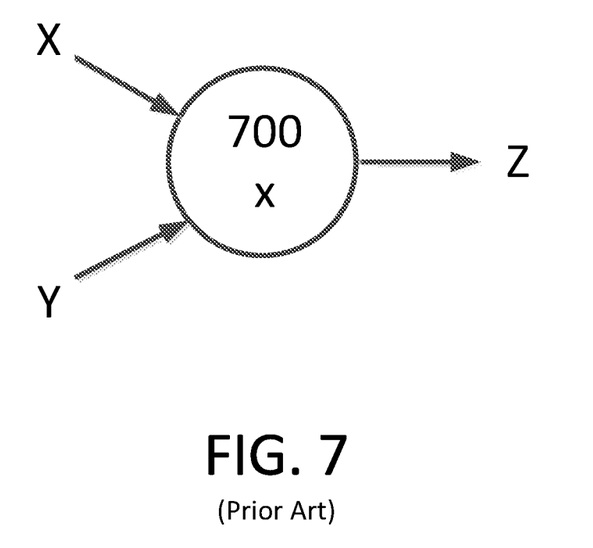
FIG. 7 is a diagram of a multiplier as is known in the prior art.

FIG. 7 is a diagram of a multiplier 700, as indicated by the "X" symbol in the figure, as is known in the prior art. In similar fashion to the adder 600 of FIG. 6, in multiplier 700 digital numbers on input buses X and Y cause the multiplier to output a digital number on output bus Z that is the product of the input numbers.

While combinatorial logic circuits performing functions such as an adder or a multiplier are well known in the prior art, other functions are more difficult to implement. For example, in the known art the division of two digital numbers is not achieved by a simple combinatorial logic circuit but rather with iteration; a successive approximation to the solution proceeds over multiple cycles of a clock, the clock cycles controlling successive states, until the error is sufficiently low. By contrast, under the present approach, a combinatorial logic circuit may find the division of two digital numbers without the need for any intermediate clock signal, and thus is deemed by those of skill in the art to occur in a single cycle without iteration.

Figure 8:
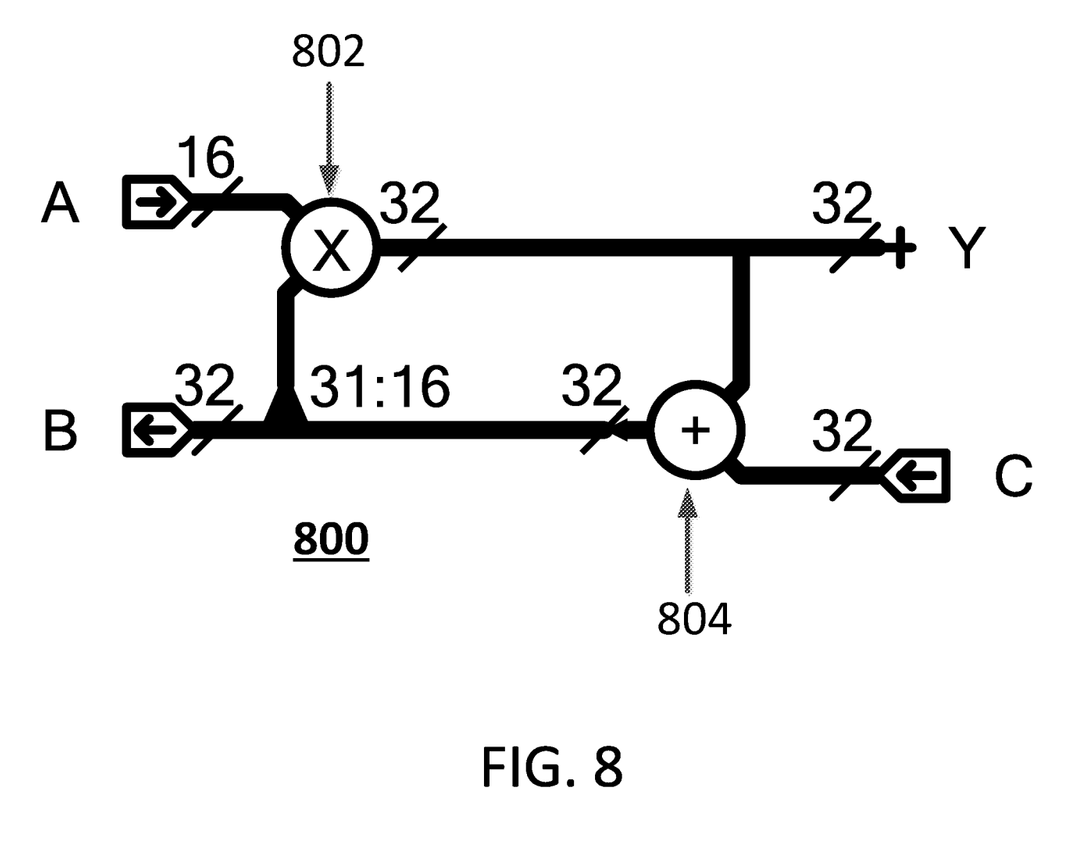
FIG. 8 is a diagram of a divider according to one embodiment of the present approach.

FIG. 8 is a diagram of a combinatorial logic circuit 800 that functions as a divider according to one embodiment of the present approach. Circuit 800 contains two combinatorial logic elements, a multiplier 802 and an adder 804.

The external inputs to circuit 800 are A and C, and the output is B, as indicated in FIG. 8. An internal value Y exists only on a bus within circuit 800; the value of Y is implicit, i.e., it is not explicitly defined as an external input and is not an output of circuit 800. It may be seen that the output B is also fed back as an input to one of the combinatorial logic elements (specifically, multiplier 802) in circuit 800.

Multiplier 802 receives an external input A as well as the circuit output B, and outputs the product A*B as the internal value Y. Adder 804 adds input C to Y and results in the output B of circuit 800. Thus, the stable state of circuit 800 must be when B=Y+C, which may also be written as B=(A*B)+C. This may be rewritten to determine the output B as a function of the inputs A and C, i.e., B=C/(1−A). Circuit 800 thus functions as a divider while containing only a multiplier and an adder.

Some may assume that circuit 800 will oscillate indefinitely; however, in practice it is observed that this does not happen. Rather, circuit 800 rapidly settles on the single stable state, e.g., within several nanoseconds, in contrast to the prior art in which the iteration may take several cycles of a clock to arrive at a result with a sufficiently small error.

Figure 9:
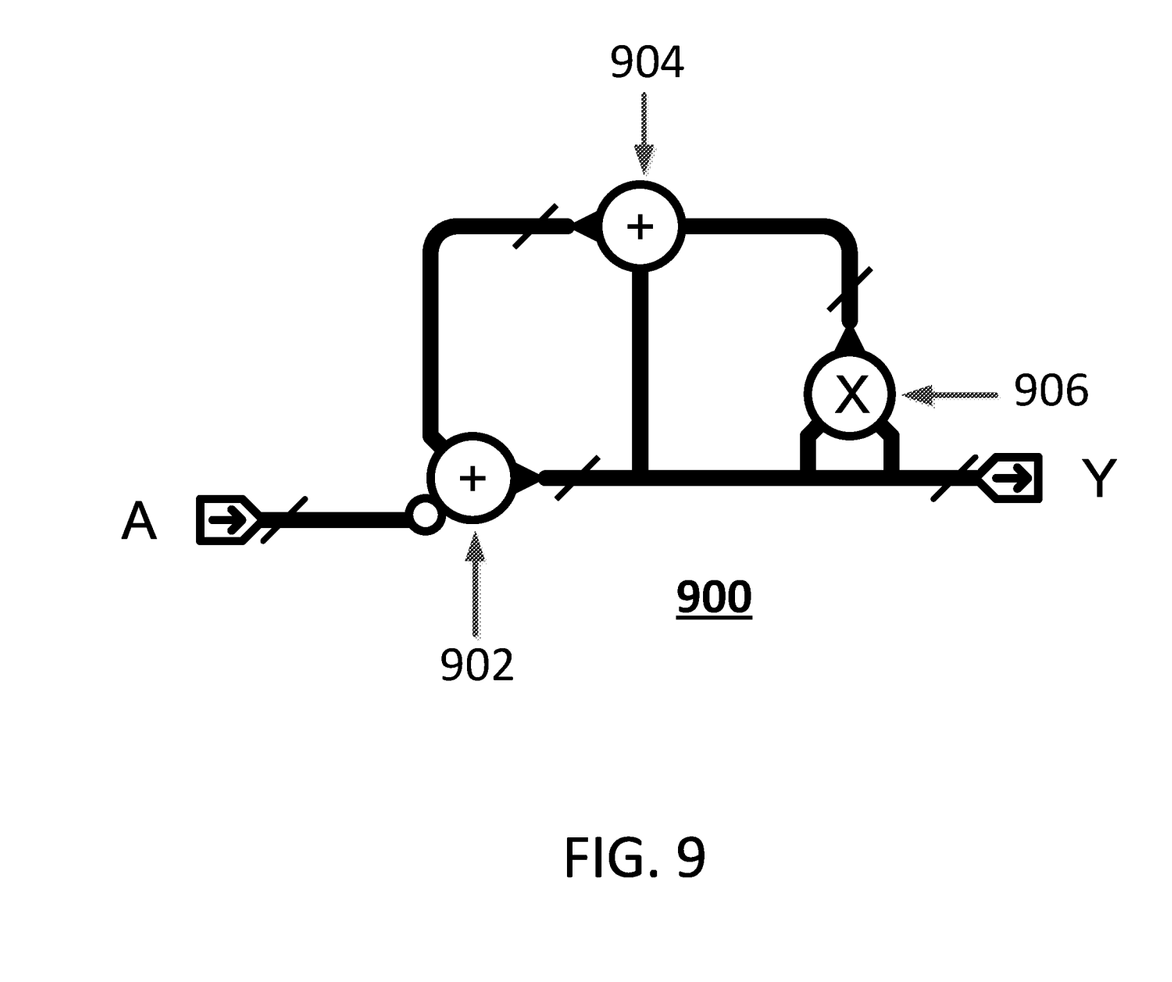
FIG. 9 is a diagram of a circuit for finding a square root according to one embodiment of the present approach.

FIG. 9 is a diagram of a combinatorial logic circuit 900 that functions as a circuit for finding a square root according to one embodiment of the present approach. Circuit 900 contains a first adder 902, a second adder 904, and a multiplier 906. Adder 902 receives an input A, which is inverted as indicated, and outputs a value Y that is the output of circuit 900.

The output value Y is fed back as both inputs to multiplier 906, which thus outputs a value that is $Y^2$. The output from multiplier 906 is an input to adder 904; the other input to adder 904 is also the output value Y, so that the output from adder 904 is $Y^2+Y$.

The output from adder 904 is an input to adder 902. As above, adder 902 also receives external input A which is inverted, so that the output from adder 902 is $Y^2+Y-A$, which is also Y. Thus, in the stable state, $Y^2+Y-A=Y$, which may be rewritten as $Y^2-A=0$, or $Y^2=A$, and thus Y is the square root of A.

As with circuit 800 of FIG. 8, circuit 900 does not oscillate indefinitely, but rapidly settles into a steady state in which the value Y on the output bus is the square root of the number A on the input bus.

One of skill in the art will appreciate that it is known that combinatorial logic elements that function as adders and multipliers may be designed to handle either positive numbers or both positive and negative numbers. A circuit designer may thus choose whether to make all of the adders and multipliers unipolar or not in a given circuit design according to the present approach.

Figure 10:
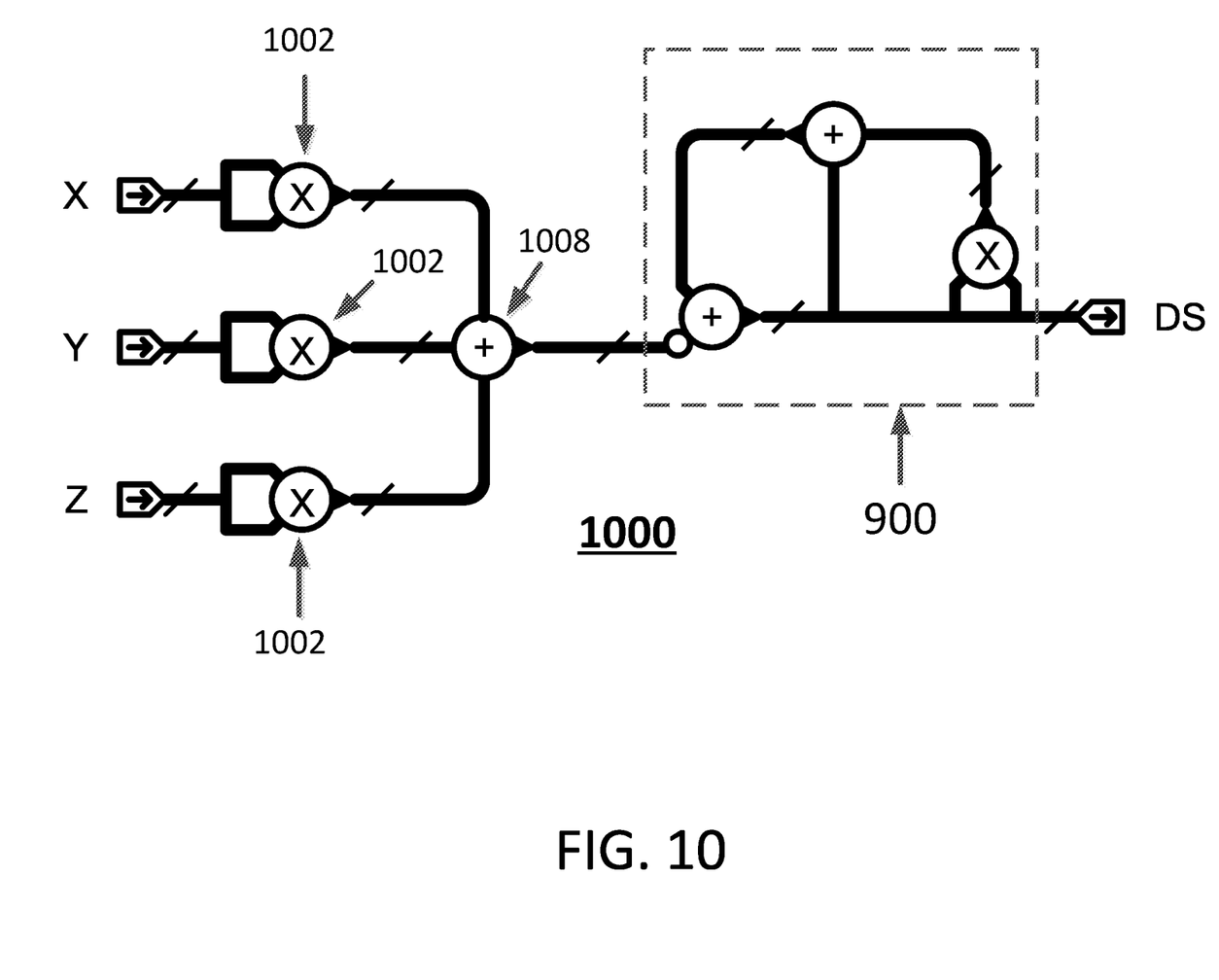
FIG. 10 is a diagram of a circuit for finding the distance to a point in a three-dimensional system according to one embodiment of the present approach.

FIG. 10 is a diagram of a combinatorial logic circuit 1000 that functions as a circuit for finding the distance to a point in a three-dimensional system according to one embodiment of the present approach.

In circuit 1000, three multipliers 1002, 1004 and 1006 receive inputs X, Y and Z, respectively, each multiplier multiplying one of the inputs by itself to obtain the square of the particular input. The three squares are then added together by adder 1008.

The output of adder 1008 is then passed to a circuit that is circuit 900 of FIG. 9, which calculates the square root of the output of adder 1008 as an output DS. It may thus be seen that, if X, Y, and Z represent distances of a target point from a reference point along three orthogonal axes in a three-dimensional coordinate system, the output value DS represents the absolute distance of the target point from the reference point.

By combining these features, it is possible to construct combinatorial logic circuits that can perform calculations not thought possible without the use of sequential logic circuits. One of skill in the art will appreciate that there are many circuits in addition to those shown and described herein that may be constructed according to these principles.

The disclosed approach has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various choices will be apparent to those of skill in the art. One of skill in the art will be able to select the appropriate number and sequence of combinatorial logic elements that is appropriate for a particular application.

These and other variations upon the embodiments are intended to be covered by the present disclosure, which is limited only by the appended claims.

What is claimed is:

1. A combinatorial circuit with feedback for producing an output that is the square root of an input, comprising:
   a first combinatorial logic adder configured to receive two input values and to produce an output value that is the sum of the two input values to the first adder and is the output of the circuit, one of the inputs to the adder being an inverse of a circuit input;
   a combinatorial circuit multiplier configured to receive two input values, each of the input values to the multiplier being feedback of the output of the circuit, and to produce an output value that is the product of the two input values to the multiplier and thereby a value that is a square of the output value; and a second combinatorial logic adder configured to receive two input values and to produce an output value that is the sum of the two input values to the second adder, one of the inputs to the second adder being the output of the multiplier and the other input to the second adder being the output of the circuit, the output of the second adder being fed back as an input to the first adder;

thereby producing a circuit output that is the square root of the circuit input.

2. The combinatorial circuit of claim 1 wherein the circuit input to the first combinatorial logic adder is the sum of the squares of three position values representing distances of a target point from a reference point along three orthogonal axes in a three-dimensional coordinate system, whereby the circuit output represents the absolute distance of the target point from the reference point.

3. A combinatorial circuit with feedback for producing a circuit output in response to one or more circuit inputs, comprising:

a plurality of combinatorial logic elements, each configured to receive a plurality of element inputs and to produce an element output;

wherein:

the element output of one of the plurality of combinatorial logic elements is the circuit output;

an element input to at least one of the plurality of combinatorial logic elements is a circuit input; and an element input to at least one of the combinatorial logic elements is feedback of the combinatorial circuit output;

and wherein:

a first one of the plurality of combinatorial logic elements is a combinatorial logic adder configured to receive two input values and to produce an output value that is the sum of the two input values to the first adder and is the output of the circuit, one of the inputs to the adder being an inverse of a circuit input;

a second one of the plurality of combinatorial logic elements is a combinatorial circuit multiplier configured to receive two input values, each of the input values to the multiplier being feedback of the output of the circuit, and to produce an output value that is the product of the two input values to the multiplier and thereby a value that is a square of the output value; and a third one of the plurality of combinatorial logic elements is a second combinatorial logic adder configured to receive two input values and to produce an output value that is the sum of the two input values to the second adder, one of the inputs to the second adder being the output of the multiplier and the other input to the second adder being the output of the circuit, the output of the second adder being fed back as an input to the first adder;

thereby producing a circuit output that is the square root of the circuit input.

\* \* \* \* \*